United States Patent [19]
Olson et al.

[11] Patent Number: 5,674,660
[45] Date of Patent: Oct. 7, 1997

[54] NON-TACKY PHOTOIMAGEABLE ELECTRODEPOSITABLE PHOTORESIST COMPOSITION

[75] Inventors: Kurt G. Olson, Gibsonia; Michael G. Sandala, Allison Park; Steven R. Zawacky, Pittsburgh; Charles F. Kahle, II, Allison Park, all of Pa.; Masayuki Nakajima, Olmsted Township, Ohio

[73] Assignee: PPG Industries, Inc., Pittsburgh,, Pa.

[21] Appl. No.: 268,778

[22] Filed: Jun. 30, 1994

Related U.S. Application Data

[63] Continuation of Ser. No. 697,355, Jan. 14, 1991, abandoned, which is a continuation-in-part of Ser. No. 562,057, Aug. 2, 1990, abandoned.

[51] Int. Cl.$^6$ .................................................... G03C 1/73
[52] U.S. Cl. ........................... 430/284.1; 430/287.1; 430/906; 430/935
[58] Field of Search .......................... 430/281, 284.1, 430/287.1, 906, 935

[56] References Cited

U.S. PATENT DOCUMENTS

| | | | |
|---|---|---|---|
| 3,501,391 | 3/1970 | Smith et al. | |
| 3,738,835 | 6/1973 | Bakos | 96/36 |
| 3,894,922 | 7/1975 | Bosso et al. | 204/181 |
| 3,935,087 | 1/1976 | Jerabek et al. | 204/181 |
| 3,936,368 | 2/1976 | Watanabe et al. | 204/181 |
| 3,936,405 | 2/1976 | Sturni et al. | 204/181 |
| 3,937,679 | 2/1976 | Bosso et al. | 204/181 |
| 3,954,587 | 5/1976 | Kokawa | 204/181 |
| 3,959,106 | 5/1976 | Bosso et al. | 204/181 |
| 4,038,232 | 7/1977 | Bosso et al. | 260/29.6 TA |
| 4,039,414 | 8/1977 | McGinniss | 204/181 |
| 4,066,523 | 1/1978 | McGinniss | 204/159.15 |
| 4,105,518 | 8/1978 | McGinniss | 204/159.14 |
| 4,166,017 | 8/1979 | McGinniss | 204/181 C |
| 4,321,304 | 3/1982 | Castellucci | 428/418 |
| 4,338,232 | 7/1982 | Harris et al. | 523/414 |
| 4,592,816 | 6/1986 | Emmons et al. | 204/180.6 |
| 4,601,916 | 7/1986 | Arachtingi | 427/97 |
| 4,632,891 | 12/1986 | Banks et al. | 430/18 |
| 4,632,900 | 12/1986 | Demmer et al. | 430/323 |
| 4,671,854 | 6/1987 | Ishikawa et al. | 430/318 |
| 4,673,458 | 6/1987 | Ishikawa et al. | 156/659.1 |
| 4,746,399 | 5/1988 | Demmer et al. | 456/656 |
| 4,751,172 | 6/1988 | Rodriguez et al. | 430/314 |
| 4,760,013 | 7/1988 | Hacker et al. | 430/280 |
| 4,828,948 | 5/1989 | Ahne et al. | 430/284 X |
| 4,839,253 | 6/1989 | Demmer et al. | 430/190 |
| 4,845,012 | 7/1989 | Seko et al. | 430/287 |
| 4,861,438 | 8/1989 | Banks et al. | 204/15 |
| 4,863,757 | 9/1989 | Durand | 427/47 |
| 4,863,827 | 9/1989 | Jain et al. | 430/145 |
| 4,863,828 | 9/1989 | Kawabe et al. | 430/191 |
| 4,863,829 | 9/1989 | Furuta et al. | 430/192 |
| 4,877,818 | 10/1989 | Emmons et al. | 522/26 |
| 4,883,571 | 11/1989 | Kondo et al. | 204/180.6 |
| 4,888,269 | 12/1989 | Sato et al. | 430/284 X |
| 4,898,656 | 2/1990 | Hoshino et al. | 204/180.6 |
| 4,975,347 | 12/1990 | Ahne et al. | 430/284 X |
| 5,002,858 | 3/1991 | Demmer et al. | 430/325 |
| 5,102,775 | 4/1992 | Okuhara et al. | 430/287.1 |

FOREIGN PATENT DOCUMENTS

| | | |
|---|---|---|
| 1319776 | 6/1993 | Canada . |
| 302 827 | 2/1989 | European Pat. Off. . |
| 315 165 | 5/1989 | European Pat. Off. . |
| 326 655 | 8/1989 | European Pat. Off. . |
| 335 330 | 10/1989 | European Pat. Off. . |
| 474 163 A1 | 9/1991 | European Pat. Off. . |
| 481 709 A1 | 10/1991 | European Pat. Off. . |
| 4-86666 | 7/1990 | Japan . |
| 4-66948 | 7/1990 | Japan . |
| 2 193 727 | 2/1988 | United Kingdom . |

*Primary Examiner*—George F. Lesmes
*Assistant Examiner*—Laura Weiner
*Attorney, Agent, or Firm*—Dennis G. Millman; Paul S. Chirgott

[57] ABSTRACT

An electrodepositable photoresist composition comprising an aqueous dispersion of: (a) a water-dispersible neutralized cationic polymeric material having a pendant unsaturation, (b) a nonionic unsaturated material and (c) a photoinitiator; characterized in that it can form smooth, thin and pinhole free coatings and further characterized in that the film is capable of being selectively insolubilized by patterned radiation exposure such that the unexposed portion of the film is soluble in dilute aqueous acid and the exposed portion is insoluble in said aqueous acid.

19 Claims, No Drawings

NON-TACKY PHOTOIMAGEABLE ELECTRODEPOSITABLE PHOTORESIST COMPOSITION

CROSS REFERENCE TO RELATED APPLICATIONS

This application is a continuation of application Ser. No. 07/697,355, filed Jan. 14, 1991, which is a continuation-in-part of application Ser. No. 07/562,057, filed Aug. 2, 1990, both now abandoned.

BACKGROUND OF THE INVENTION

1. Field of the Invention

The present invention relates to electrodepositable photoresist compositions. More specifically, the present invention relates to electrodepositable photoresist compositions with improved sensitivity and resolution. The photoresist compositions are particularly useful in the manufacture of circuit boards and printing plates.

2. Brief Description of the Prior Art

Electrodepositable photoresist compositions are generally known in the art. In a broad sense, the art has described photosensitive electrodepositable compositions which are intended to produce permanently or temporarily adhering films. To the extent that the films are difficult to remove, as is the case with paints, the art relating thereto is non-informing in the area as to photoresist compositions.

Of interest here are photoresist compositions that form photoimages such as printed circuits or lithographic printing plates. In essence, photoresist compositions form films which are insolubilized with an energy source such as actinic irradiation using a photomask. This enables selective irradiation of masked or unmasked areas of the films. The films are then developed by removing the masked or unmasked areas thereof depending on whether the photoresist is negative or positive respectively.

Electrodeposition of photoresist compositions even when otherwise successful are not often commonly usable. Some of the shortcomings of the art-known electrodepositable photoresist compositions resides in problems of tackiness or stickiness and/or the associated problems of poor light sensitivity and resolution. Films of the art known compositions tend to stick or otherwise adhere to photomasks that are placed on them in the process of producing the required patterns. The photomask (or phototool) is a self-supporting film on which is a pattern of a desired image which is transferred to a substrate. Removal of the photomasks from the sticky films can damage the photoresists and/or photomasks. The damaged photoresist becomes susceptible to attack by etchants, thus causing an unacceptable image transfer and consequently defects in the final products. The damaged photomasks become unacceptable for subsequent use, thus increasing the cost of production.

The prior art, in an attempt to overcome the above problems, employs cover sheets or coatings which are typically placed over photoresists in order to prevent sticking of the photomasks to photoresists. However, the presence of cover sheets or coatings adversely affects resolution of the films because incident light is diffracted as it passes through the mask and the cover sheet or coating. The diffraction or "spreading" of the incident light becomes more pronounced as the distance between the photomask and the photoresist increases. Photosensitivity can also be adversely affected if the cover sheet or coating absorbs any of the incident light.

By the present invention, there are provided non-tacky photoresist compositions having good photosensitivity and resolution.

SUMMARY OF THE INVENTION

In accordance with the foregoing, the present invention encompasses an electrodepositable photoresist composition comprising an aqueous dispersion of (a) a water-dispersible unsaturated cationic polymeric material, (b) a nonionic unsaturated material and (c) a photoinitiator; said composition is characterized in that it forms a thin and uniform electrodeposited film having an improved photosensitivity and resolution, and further characterized in that the film is effectively insolubilized by selective patterned radiation exposure to actinic radiation such that the unexposed portion of the film is removable with a dilute aqueous acid and the exposed portion is insoluble in said aqueous acid.

In the presently preferred embodiment of the invention, the electrodepositable photoresist composition comprises an aqueous dispersion of an acid-neutralized amine-functional unsaturated cationic polymeric material. The amine-functional unsaturated cationic polymeric material is preferably an epoxy-amine adduct, for example, the reaction product of a diglycidyl ether and methylethanolamine which is neutralized with an acid such as lactic acid. The epoxy-amine adduct is typically modified by incorporating therein an ethylenically unsaturated group via a covalent bond. The nonionic unsaturated compound can be an acrylate such as trimethylolpropane triacrylate. The photoinitiator can be isopropyl thioxanthone. The preferred resinous composition has been found to exhibit an improved photosensitivity and resolution; said composition is non-tacky when electrodeposited and dehydrated.

The invention also encompassed a process for preparing a photoresist and an article of matter on which one has applied the photoresist. The photoresist of the invention is characterized in that it is a thin, uniform (smooth and pinhole-free) electrodeposited film.

By the term "non-tacky" herein is meant that a film of the photoresist composition does not stick to or otherwise adhere to a photomask in a manner that would cause an appreciable damage to the photoresist and/or the photomask, as described hereinbefore. The term "photosensitivity" relates to the light exposure dose which is required to insolubilize a film, when it is in contact with a developing solution. Generally, the higher the sensitivity, the lower is the required light exposure dose. Light exposure dose is measured in millijoules per square centimeter. The term resolution relates to the minimum width of lines and spaces of an image from the photomask that can be reproduced accurately on a surface.

DETAILED DESCRIPTION OF THE INVENTION

The electrodepositable photoresist composition of this invention is characterized in that it can form a thin, uniform (smooth and pinhole-free) electrodeposited film having improved photosensitivity and resolution. Film thicknesses can range from about 0.01 to 3 mils and preferably about 0.1 to 1.5 mils. The film is said to be smooth and pinhole-free in that there are no discontinuities in the film which can cause defects in (the traces of) the final product. In the preferred embodiment of the invention, the dehydrated film of the photoresist composition is non-tacky.

As set forth more fully hereinbelow, the components of the electrodepositable photoresist compositions are selected on the basis that give rise to the above characteristics and other useful compositional and performance properties. The principal ingredients of the composition are an unsaturated ionic polymeric material, a nonionic unsaturated material and a photoinitiator, and, optionally, a colorant.

The preferred unsaturated ionic polymeric material is a cationic, acid-neutralized, unsaturated amine-functional polymeric material. An illustrative example thereof can be an unsaturated epoxy-amine adduct. The useful epoxy materials can be monomeric or polymeric compounds or mixture of compounds having an average of one or more epoxy groups per molecule. Although monoepoxides can be utilized, it is preferred that the epoxy materials contain more than one epoxy group per molecule. The epoxy materials can be essentially any of the well-known epoxides. A particularly useful class of polyepoxides are polyglycidyl ethers of polyphenols such as bisphenol A. These can be produced, for example, by etherification of a polyphenol with epichlorohydrin in the presence of an alkali. The phenolic compound may be, for example, bis(4-hydroxyphenyl)2,2-propane, 4,4'-dihydroxy benzophenone, bis(4-hydroxyphenyl)1,1-ethane, nonyl phenol, resorcinol, catechol, bis(4-hydroxyphenyl)1,1-isobutane, bis(4-hydroxytertiarybutyl phenyl)2,2-propane, bis(2-hydroxynaphthyl)methane, 1,5-dihydroxynaphthylene, or the like. In many instances, it is desirable to employ such polyepoxides having somewhat higher molecular weight and preferably containing aromatic groups. These polyepoxides can be made by reacting the diglycidyl ether set forth above with a polyphenol such as bisphenol A. Preferably, the polyglycidyl ether of a polyphenol contains free hydroxyl groups in addition to epoxide groups. While the polyglycidyl ethers of polyphenols may be employed per se, it is frequently desirable to react a portion of the reactive sites (hydroxyl or in some instances epoxy) with a modifying material to vary the film characteristics of the resin.

Another quite useful class of polyepoxides are produced similarly from novolac resins or similar polyphenol resins. Also suitable are the similar polyglycidyl ethers of polyhydric alcohols which may be derived from such polyhydric alcohols as ethylene glycol, diethylene glycol, triethylene glycol, 1,2-propylene glycol, 1,4-propylene glycol, 1,5-pentanediol, 1,2,6-hexanetriol, glycerol, bis(4-hydroxycyclohexyl)2,2-propane and the like. There can also be used polyglycidyl esters of polycarboxylic acids, which are produced by the reaction of epichlorohydrin or similar epoxy compounds with an aliphatic or aromatic polycarboxylic acid such as oxalic acid, succinic acid, glutaric acid, terephthalic acid, 2,6-naphthylene dicarboxylic acid, dimerized linolenic acid and the like. Examples are glycidyl adipate and glycidyl phthalate. Also useful are polyepoxides derived from the epoxidation of an olefinically unsaturated alicyclic compound. Included are diepoxides comprising in part one or more monoepoxides. These polyepoxides are non-phenolic and are obtained by the epoxidation of alicyclic olefins, for example, by oxygen and selected metal catalysts, by perbenzoic acids, by acetaldehyde monoperacetate, or by peracetic acid. Among such polyepoxides are the epoxy alicyclic ethers and esters which are well-known in the art.

Other epoxy-containing compounds and resins include nitrogeneous diepoxides such as disclosed in U.S. Pat. No. 3,365,471; epoxy resins from 1,1-methylene bis(5-substituted hydantoin), U.S. Pat. No. 3,391,097; bisimide-containing diepoxides, U.S. Pat. No. 3,450,711, epoxylated aminoethyldiphenyl oxides, U.S. Pat. No. 3,312,644; heterocyclic N,N'-diglycidyl compounds, U.S. Pat. No. 3,503, 979; amine epoxy phosphonates, British Patent 1,172,916; 1,3,5-triglycidyl isocyanurates, as well as other epoxy-containing materials known in the art. The epoxy equivalent weight of the epoxy material (grams of solid resin per equivalent of epoxy) can be 100 to 5,000 and preferably 200 to 1,000.

The amines useful in preparing the polyepoxide amine adduct can be ammonia, primary, secondary and tertiary amines and a mixture thereof. Illustrative examples of the useful amines can be dibutylamine, methyl ethanolamine, dimethylamine, diethanolamines, and the diketimine of diethylene triamine, polyoxyalkylene polyamine such as Jeffamines® (from Texaco Co.), diethylamine, morpholine, dimethylamine, propylamine, diisopropanolamine, butylamine, ethylamine, triethylamine, triethanolamine, dimethylethanolamine and the like or a mixture thereof, e.g., dibutylamine and methylethanolamine. The epoxy-amine adduct can be at least partially neutralized with an acid to form a polymeric product containing amine salt and/or quaternary ammonium salt groups. U.S. Pat. No. 4,260,720, column 5, line 20, to column 7, line 4, the portions of which are hereby incorporated by reference, discloses polyepoxide amine adducts and methods of preparing the same.

With regard to the amount of organic amine and polyepoxide which are reacted with one another, the relative amounts depend upon the extent of cationic base, such as cationic salt group formation, desired and this, in turn, will depend upon the molecular weight of the polymer. The extent of cationic salt group formation and the molecular weight of the reaction product should be selected such that when the resultant cationic polymer is mixed with aqueous medium, a stable dispersion will form. A stable dispersion is one which does not settle or is one which is easily dispersible if some sedimentation occurs. The dispersion should additionally be of sufficient cationic character that the dispersed polymer particles will migrate towards the cathode when an electrical potential is impressed between an anode and a cathode immersed in the aqueous dispersion.

The molecular weight, structure and extent of cationic salt group formation should be controlled such that the dispersed polymer will have the required flow to form a continuous film on the electrode; in the case of cationic electrodeposition, to form a film on the cathode. The film should be insensitive to moisture to the extent that it will not appreciably redissolve in the electrodeposition bath or be easily rinsed away by an aqueous solution from the coated surface after removal from the bath. Also, the molecular weight, structure and extent of cationic salt group formation should be controlled such that the deposited and dehydrated film will be dissolvable in aqueous acids during development of the photoresist film.

In accordance with the invention, the amines, including aromatic amines in the presence of certain photoinitiators, are realized to be "coinitiators" of photopolymerization. Hence, the amine employed herein, as to type and/or amount, can have an appreciable effect on the photosensitivity of the photoresist film. Without being bound by any particular theory, it is believed that the amines as aforestated increase the number of potential crosslinkable sites in the photoresist composition which are capable of participating in the insolubilization reaction. Differently put, the concentration of the reactive sites in the photoresist composition is thereby increased. Thus, the photoresist composition can be more readily insolubilized with a relatively small but effective content of unsaturated groups. Epoxy-amine adducts and preferably epoxy polymers containing an aromatic group, e.g., aromatic epoxy-amine adducts are believed to be particularly effective in improving photosensitivity of the photoresist composition.

In general, most of the cationic polymers e.g., the epoxy-amine adducts useful in the practice of the invention will have weight average molecular weights within the range of about 1,000 to 500,000 and contain from about 0.1 to 2, and preferably about 0.2 to 1.0 milliequivalents of basic group, e.g., cationic group, per gram of resin solids. Given the teachings herein, one can couple the molecular weight with the cationic group content to arrive at a satisfactory polymer. The epoxy equivalent weight before amination can be 100 to 5,000 and preferably about 200 to 1,000. The cationic groups can alternatively be introduced into the polyepoxide by reacting into the epoxy groups with a sulfide or phosphine and an acid, thus forming cationic sulfonium or phosphonium groups. Cationic resins that contain both sulfonium and amine salt groups can also be made as described in U.S. Pat. No. 3,935,087 which is hereby incorporated by reference.

An unsaturated moiety can be introduced into the cationic polymeric material or a precursor thereof. The resultant unsaturated cationic polymeric material contains on the average at least one ethylenically unsaturated moiety per molecule. In a preferred embodiment, the unsaturated moiety is derived from the partial reaction of isophorone diisocyanate with an active hydrogen containing ethylenically unsaturated compound such as 2-hydroxyethyl acrylate. The term "active hydrogen-containing ethylenically unsaturated compound" includes active hydroxyl-containing ethylenically unsaturated compounds. The resultant product can be described as a partially capped or partially blocked isocyanate. The partially capped isocyanate is then reacted with the aforedescribed polyepoxide adduct. Other than isophorone diisocyanate and the hydroxyethyl acrylate, other polyisocyanates and other compounds, which are preferably diisocyanates, can be substituted therefor in order to produce the half-capped isocyanates containing an unsaturated moiety. Illustrative examples of the other polyisocyanates can be aliphatic isocyanates such as alkylene isocyanates, e.g., trimethylene, tetramethylene, pentamethylene, hexamethylene, 1,2-propylene, 1,2-butylene, 2,3-butylene, 1,3-butylene, ethylidene and butylidene diisocyanates and the cycloalkylene isocyanates, e.g., 1,3-cyclopentane, 1,4-cyclohexane, 1,2-cyclohexane diisocyanates and aromatic isocyanates such as arylene isocyanates, e.g., m-phenylene, p-phenylene, 4,4'-diphenyl, 1,5-naphthalene and 1,4-naphthalene diisocyanates and alkarylene isocyanates, e.g., 4,4'-diphenyl methane, 2,4-or 2,6-tolylene, or mixtures thereof, 4,4'-toluidine, and 1,4-xylylene diisocyanates; nuclear-substituted aromatic compounds, e.g., dianisidine diisocyanate, 4,4'-diphenylether diisocyanate and chlorodiphenylene diisocyanate. Triisocyanates such as triphenyl methane-4,4',4"-triisocyanate, 1,3,5-triisocyanato benzene and 2,4,6-triisocyanato toluene; and the tetraisocyanates such as 4,4'-diphenyldimethyl methane-2,2',5,5"-tetraisocyanate and polymerized polyisocyanates such as tolylene diisocyanate dimers and trimers and the like can also be used herein.

In addition, the polyisocyanates may be prepolymers derived from polyols such as polyether polyols or polyester polyols, including polyols which are reacted with excess polyisocyanates, such as mentioned above, to form isocyanate-terminated prepolymers. Examples of the suitable isocyanate prepolymers are described in U.S. Pat. No. 3,799,854, column 2, lines 22 to 53, which is herein incorporated by reference.

Illustrative examples of other compounds from which the unsaturated moiety can be derived are hydroxypropyl acrylate, hydroxyethyl methacrylate, t-butylamino ethyl methacrylate, N-methylolacrylamide, caprolactone: acrylic acid adducts, meta isopropenyl $\alpha,\alpha$-dimethyl-isocyanate and mixtures thereof. The resultant unsaturated polymeric material has pendant unsaturation. By "pendant" is meant unsaturation which is attached to the polymer by means of a covalent or ionic bond.

The useful unsaturated cationic polymeric materials, which are typically amine-functional polymeric materials with pendant unsaturation can have weight average molecular weights of about 1,500 to 1,000,000 and preferably about 2,000 to 500,000. Unsaturation equivalent (gram solid resin/equivalent of unsaturation) of the material can be from about 750 to 1,000,000 and preferably 1,000 to 50,000. Typically, the glass transition temperature (Tg) of the unsaturated cationic polymeric material is from 0° C. to 130° C. and more preferably 10° C. to 80° C. Milliequivalents of the basic group, e.g., cationic group, can be 0.1 to 5.0 and preferably 0.2 to 1.0 per gram of resin solids.

In making the amine-functional polymeric material cationic, it is at least partially neutralized with an acid, preferably in the presence of water. Illustrative examples of the acid can be lactic and acetic acid, formic, sulfuric, phosphoric, propionic, hydroxy acetic, acrylic, mathacrylic, glycolic, butyric, dimethylol propionic, 12 hydroxy stearic, etc. The neutralized material can be dispersed in water during or after the neutralization. The resultant dispersion is useful in a cationic electro-deposition composition. Besides the cationic polymeric material, anionic polymeric materials can be employed in an electrodepositable composition.

As afore-stated, a nonionic unsaturated material is employed in combination with the afore-described unsaturated polymeric cationic material. Typically the nonionic unsaturated materials are blended with the unsaturated cationic materials prior to dispersion in water. The nonionic unsaturated material can be a mono or multifunctional unsaturated material, e.g., a diacrylate of a polyepoxide, or an acrylate ester of an ethoxylated or propoxylated polyphenol, an acrylate ester of trimethylolpropane or pentaerythritol or a mixture thereof. Amounts of about 1 to 70 percent and preferably about 5 to 40 percent by weight of the nonionic unsaturated material, based on total resin solids weight of the bath can be employed. Unsaturation equivalent weight of these nonionic materials can range from about 90 to 1000 or higher. Illustrative but non-limiting examples of the unsaturated nonionic materials can be epoxy acrylates, urethane acrylates, ether acrylates, ester acrylates and ethylenically unsaturated resin such as acrylated melamine resins and acrylated acrylic resins. Preferably, the nonionic unsaturated materials contain 2 or more unsaturated groups per molecule. Specific but non-limiting examples of the preferred nonionic materials can be a diacrylate of a diglycidyl ether of bisphenol A, trimethylolpropane triacrylate, pentaerythritol triacrylate, a diacrylate ester of ethoxylated diphenol and a mixture thereof.

The percent of equivalents of unsaturation derived from the cationic material is from about 5 to 80 percent, and preferably 10 to 50 percent of the total unsaturation equivalents of the photoresist composition. The percent of equivalents of unsaturation derived from the nonionic material is from about 95 to 20 percent and preferably 90 to 50 percent.

As photoinitiators, there are herein employed compounds which will initiate polymerization of the unsaturated groups of the electrodepositable photoresist composition when a film of the photoresist composition is exposed to actinic radiation of an appropriate energy. Illustrative examples of the photoinitiators can be thioxanthones, phosphine oxides, quinones, benzophenones, benzoin, acetophenones, benzoin ethers, and benzil ketals. The preferred photoinitiators can be isopropyl thioxanthone, 1-chloro thioxanthone (or other thioxanthane derivatives), Benzoin ethers, e.g., IRGA-CURE® 907 (Ciba Geigy Co.), and a combination thereof. The photoinitiator can be made an integral part of the resinous materials used herein. However, in the preferred embodiment of the invention, the photoinitiator is external to the resinous material, namely the unsaturated cationic polymeric material. The photoinitiator can be employed in an amount of about 0.05 to 12 percent and preferably about 0.5 to 8 percent based on total resin solids. The photoinitiator can be added before, during or after the dispersion is prepared.

In preparing the electrodepositable photoresist compositions, the aforedescribed components can be mixed to produce a dispersion. The mixture is then dispersed in an aqueous acid solution such as lactic acid solution. Additional water can be added to the dispersion to reduce the solids content. Also, the dispersion can be stripped in order to remove volatile organic solvents. The resultant dispersion has a resin solids content of about 5 to 50 percent and preferably 10 to 40 percent. The photoresist composition can have milliequivalents of acid per gram of resin solids from about 0.1 to 2.0; milliequivalents of amine per gram of resin solids from about 0.1 to 5; number average molecular weight (Mn) from about 500 to 50,000, unsaturation equivalent (gram solid resin per equivalent of unsaturation) of 300 to 25,000, and Tg of the resultant dehydrated film can be 0° C. to 100° C.

In addition to the above components, various formulating additives can be employed herein. For instance, since film-smoothness is of importance, additives that can decrease surface defects, e.g., crater control agents can be employed herein. Illustrative but non-limiting examples thereof can be chain-extended epoxy materials such as polyepoxide-polyoxyalkylene polyamine adducts, polypropylene oxides, and other high molecular weight cationic polymers. There can also be employed herein as crater control agents silicone materials such as organo silicone fluids that can also increase slip and thus improve release of the photoresist from the photomask.

It is a distinct feature of the invention that an improved photosensitivity can be obtained and consequently an effective insolubilization can be obtained with relatively hard films. Hardness of the film can be measured by its softening temperature or glass transition temperature (Tg). In accordance with this invention the hard films are non-tacky.

As electrodepositable photoresist compositions, the resin solids content thereof can be from about 3 to 25 percent and preferably about 5 to 20 percent; pH can be from about 3 to 9 and preferably about 4 to 7 and conductivity can be from about 200 to 2,000 micromhos per centimeter and preferably about 400 to 1,500 micromhos per centimeter. In the process of electrodeposition, the aqueous dispersion of the photoresist composition is placed in contact with an electrically-conductive anode and an electrically-conductive cathode. The surface to be coated can be made the cathode or the anode. In the case of cationic electrodeposition, which is preferred herein, the surface to be coated is the cathode. Following contact with the aqueous dispersion, an adherent film of the coating composition is deposited on the electrode being coated when a sufficient voltage is impressed between the electrodes. Conditions under which electrodeposition is carried out can be as follows. The applied voltage may be varied and can be, for example, as low as one volt or as high as several thousand volts, but is typically between about 10 and 400 volts. Current density is usually between 1 amperes and 10 amperes per square foot and tends to decrease during electrodeposition indicating the formation of an insulating film. Electrodeposition time can vary from 5 to 200 seconds. The electrodeposited film having a thickness of 0.01 to 3 mil, upon dehydration, is substantially tack-free. Generally, the electrodeposited film is dehydrated by an infrared bake, a short oven bake, or an air blow-off. The non-tacky nature of the film can be measured, for example, by a sward hardness test in which a metal rocker is placed on the dehydrated photoresist film and set in motion. Softer, more tacky films will damp the rocking motion more quickly than harder, less tacky films. Typically, the Sward rocker hardness (ASTM D2134-66 modified) of the dehydrated film is from about 5 to 60, and preferably from about 10 to 50 measured at room temperature at 55 percent relative humidity.

In the process for preparing the patterned photoresist, a photomask is placed on the dehydrated photoresist which is then exposed to actinic radiation. In accordance with this invention, the dehydrated photoresist can be directly covered with a photomask to make an intimate contact therewith. Photomask (or tool) is a film on which is printed a pattern which is the negative (or positive) of the desired image. Actinic radiation is shown through the regions of the photoresist film which are transparent to said radiation in order to transfer the image of the photomask onto the photoresist film.

Because the films of the claimed compositions are particularly smooth and non-tacky, intimate contact can be made between the films and photomasks. This minimizes scattering of incident light from an irradiation source, as light passes through the mask. By "intimate contact" is meant that little or no space is left between the photomask and the photoresist. As aforestated, the prior art photoresists typically are tacky and thus require covers in the form of sheets or protective coatings in order to protect photomasks. These covers make intimate contact between the photomasks and the photoresists impossible. The greater the separation between the photomasks and the photoresists, the greater is the amount of light diffraction that takes place before light impinges on the photoresists. Consequently, there is a reduced accuracy of the transfer of the photomask images into the photoresists. Therefore, intimate contact between mask and photoresist is desirable and is provided in accordance with the present invention in order to achieve maximum accuracy of image transfer and resolution. In the instance of this invention less than 500 millijoules per square centimeter and preferably less than 200 millijoules per square centimeter of light exposure dose (irradiation) is required to insolubilize an electrodeposited and dehydrated film having a thickness of less than or equal to 0.4 mil (on a flat surface) when it is exposed to dilute aqueous acidic solution. Irradiation can be conducted with ultra-violet (UV) light produced by various lamps having an average emission wavelength of <200 to 700 nanometers (nm). Generally, the conditions for irradiation will depend on the nature of the source of irradiation, film thickness and the like.

After irradiation and removal of the photomask, the photoresist film is developed. In the preferred embodiment of this invention, the photomask is removed easily without any significant photoresist film remaining thereon. Without being bound to any particular theory, it is believed that the photomask is effectively removed because of the non-tacky nature (or non-blocking nature) of the films of the electrodepositable composition.

Development of the photoresist film entails subjecting it to a developing solution by spraying, dipping, or the like. The developing solution for cationic polymeric materials is usually an acidic aqueous solution. The acids useful herein can be the same as used in neutralizing the polymeric material as aforedescribed. Illustratively lactic acid, acetic acid, formic acid, propionic acid and dimethylolpropionic acid can be used herein with lactic acid or acetic acid being preferred. Usually, the photoresist film is developed at a temperature of 0 to 180° F. over a period of 10 seconds to 10 minutes. Typically, the concentration of the acid in the developing solution can be from 0.05 to 20 weight percent in water. The exposed areas of a negative photoresist become insolubilized, i.e., less soluble to a developing solution. The opposite is true for positive photoresists. Hence, there is a solubility differential between the exposed and unexposed areas of the photoresist film, and the developing solution removes one or the other. The term solubility differential denotes that the rate of removal of the film by the developing solution is slower in the exposed areas (negative resist) relative to the unexposed areas. For a negative photoresist, the unexposed areas of the film are removed. After the development, the portion of the substrate that is not covered by the photoresist is etched to form a circuit.

Etching involves the removal of the conductive substrate that is not covered with the photoresist film. Etching is conducted by subjecting the uncovered substrate to an etchant comprising ferric chloride solutions, cupric chloride, alkaline ammoniacal etchants or peroxide: sulfuric acid. The etchant is usually sprayed onto the developed surfaces. The etchant is usually at a temperature of about 0 to 150° F. and remains on the surface of the substrate for a sufficient time (about 1 to 20 minutes) to remove the exposed copper metal. It is of note that cationic polymers are resistant to alkaline etchants. Amine functional epoxy resins are not expected to swell in alkaline solutions (etchants). Thus resolution is not compromised. Films derived from epoxy resins, in general, will resist attack by the various etchants used in the industry, (e.g. $CuCl_2$, $FeCl_3$, and peroxide: sulfuric acid (Printed Circuits Handbook, Clyde F. Coombs, Jr. Editor in Chief, Third Edition, McGraw & Hill Book Co. (1988)).

After etching, stripping means are employed to remove the remaining photoresist film from the substrate. Stripping solutions comprising aqueous acids can be employed when cationic polymers are used. Usually stripping is conducted by placing the etched substrate in the stripping solution at a temperature of about room temperature to about 212° F. over a period of about 10 seconds to 10 minutes. Photoresist film is removed from the unetched copper by this treatment.

This and other aspects of the invention are described by the following non-limiting examples.

EXAMPLES

Example 1A

Urethane Acrylate from the Reaction of IPDI with 2-Hydroxyethyl Acrylate

Isophorone diisocyanate "IPDI" (687.4 grams (g) having 6.21 NCO equivalents) were charged into a 3-liter four-neck round bottom flask which was equipped with a mechanical stirrer, a thermometer, a dropping funnel, and a condenser. A calcium sulfate drying tube was attached to the condenser to protect it from moisture. The flask was heated to 50° C. under stirring. Dibutyltin dilaurate (0.4 g) was added to the IPDI and a mixture of 2-hydroxyethyl acrylate (367.8 g, 3.17 OH equivalents) and IONOL®, which is di-t-butyl-p-cresol (6.3 g), was added to the IPDI at 50° C. to 55° C. through the dropping funnel over the period of 1.5 hours. After the addition was completed, the mixture was stirred at 50° C. for an additional 4 hours to give urethane acrylate (NCO equivalent weight of 350.8) in which free IPDI was estimated to be 0.2 percent (wt/wt) present by HPLC (High Pressure Liquid Chromatography).

Example 1B

A mixture of EPON® 1001 (an epoxy resin from Shell Chemical Co. having epoxy equivalent weight "EEW" =534; 1068.0 g) and 4-methyl-2-pentanone (224.3 g) was charged into a 3-liter four-neck round bottom flask which was equipped with a mechanical stirrer, a thermometer, and a Dean-Stark condenser. The flask was heated to reflux in order to remove moisture from the epoxy resin. After the removal of moisture, the flask was cooled to 65° C. and 2-(methylamino)ethanol (1.5 mole; 112.7 g) was added through a dropping funnel over a period of five minutes. An exothermic reaction took place as soon as the addition was completed, and the reaction temperature was maintained at 110° C. until EEW became greater than 24,000. The flask containing the resultant reaction product comprising an epoxy-amine adduct was then cooled to 80° C. and a mixture of the urethane acrylate from Example 1A (338.2 g; 0.99 NCO equivalents) and 4-methyl-2-pentanone (300 g) was added to the amine-epoxy adduct at 80° C. to 85° C. through another dropping funnel over a period of 3 hours. The resulting mixture was stirred at 80° C. for an additional 2 hours to ensure the consumption of the isocyanate groups. EBECRYL® 3600 (an epoxy diacrylate available from Radcure Corporation, 519.9 g) was added to the warm amine-functional resin and the whole mixture was well mixed at 75° C. in the flask. The blended resin mixture (2000 g, 1590.8 g solids) was dispersed by addition to lactic acid (53.7 g, 0.527 equivalents) in deionized water (838.7 g). The aqueous dispersion was further reduced to 35.0 percent (wt/wt) by addition of deionized water (1652 g). 4-methyl-2-pentanone was azeotropically distilled under reduced pressure from the aqueous dispersion, giving an aqueous dispersion of amine-functional resin; solids: 39.1 percent; milliequivalent "MEQ" acid: 0.124; MEQ base: 0.304; particle size: 1440 Å; (number average molecular weight) "Mn": 17,924; (weight average molecular weight) "Mw": 95,125; (Z average molecular weight) "Mz": 468,738.

Example 2A

The procedure of Examples 1A and 1B was repeated except that 0.375 moles (25 mole percent) of the 2(methylamino)ethanol were replaced with dibutyl amine (48.5 g). After dispersion in water and stripping of the volatile solvents, a milky white dispersion resulted with the following characteristics:

(1) Total solids at 110° C.—37.2 percent; (2) Milliequivalent acid per gram—0.147; (3) Milliequivalent base per gram—0.305; (4) Particle size—2290 Å (measured by laser light scattering on Coulter N4 particle size analyzer available from Coulter Company); and (5) Molecular weight Mn=12,130, Mw=75,883, Mz=611,366.

Example 2B

An electrophoretic bath was prepared from Example 2A by first reducing the prepared resin to 30 percent solids using deionized water. Mild agitation was used to blend 1425.7 grams of this reduced polymer dispersion with 48.6 grams of trimethylol propane triacrylate. A solution of 19.4 grams of 2-isopropyl thioxanthone and 19.4 grams of 2-hydroxyethyl n-hexanol (hexyl CELLOSOLVE®) was then added to the resin blend under mild agitation. The entire bath was then reduced to 10 percent solids using deionized water. The resulting paint bath had a pH of 4.53 and a conductivity of 750 micromhos/centimeter (cm).

Epoxy-fiberglas circuit boards (available from Nelco, Inc.) measuring 8 cm ×12 cm with ½ ounce per square foot of copper on one side were placed in a detergent solution (ASTM D 2248-65) at 165° F. for 5 minutes. The panels were then washed with hot water, followed by a deionized water rinse and oven baked at 82° C. for 5 minutes. The panels were submerged in the prepared electrophoretic bath along with a stainless steel electrode measuring 5 cm ×4 cm. Each panel was attached to a direct current (DC) power supply, the panel being the cathode and the stainless steel electrode the anode. The cathode and anode were separated by a distance of approximately 5 cm with the copper side of the board facing the stainless steel anode in the bath. The bath temperature was held at 85° F. and a magnetic stirrer was used to provide mild agitation. An electrical potential of 30 volts was applied for 30 seconds, after which time the panel was removed, rinsed with a water spray, followed by a 0.1 percent by weight SURFYNOL® TG (available from Air Products Corporation)/deionized water rinse. The panel was then flashed in a forced air oven at 82° C. for 60 seconds., Assuming a coating weight of 30 grams per meter squared per mil film thickness (gm/m2/mil), a film thickness of 5 microns was calculated. The coating was smooth and tack free with no noticeable pinholing or cratering. The coated circuit board was placed in a Kepro® Model BTX-200A UV exposure frame with a polyester film photomask showing lines and spaces in 2 mil increments from 20 mils to 2 mils, and a "Stouffer 21 step density Step Tab" (available from Kepro Circuit Systems, Inc.) The step tablet is a variable-density tablet based on a change in optical density; it has been used to indicate the change in the level of resist polymerization with exposure dose. Exposure time was three minutes. Following exposure, the photo tool was removed easily from the coated circuit board. No apparent residual coating material remained on the photo tool. The exposed coating was developed by immersing the panel in a solution of 10 weight percent lactic acid at 80° F. for 75 seconds. The panel was then rinsed with a water spray and air dried. Step 8 was held on the Stouffer 21 step—Step Tab Tester (available from Kepro Circuit Systems, Inc.) and a resolution 2 mil lines and spaces was reproduced from the photo tool image. Etching occurred by spraying the sample with ferric chloride solution in a Kepro® Model BTE-202 Bench Top Etcher (available from Kepro Circuit Systems, Inc.). Etchant temperature was 110° F. and exposure time was 140 seconds. A resolution of 2 mil lines and spaces was achieved following etching. Stripping was accomplished by placing the etched panel in a bath of 10 weight percent lactic acid at a temperature of 140° F. for 120 seconds followed by a water spray. Half of the panel was covered with tape and the coated panel was again etched to check the efficiency of stripping. All of the copper was removed from the untaped coated panel surface following 120 seconds in 110° F. ferric chloride.

Example 3A

The procedure of Example 2A was repeated except that 490 grams (1.49 equivalents) of the urethane acrylate of Example 1A were used (instead of 0.99 equivalents). A milky white dispersion with the following properties resulted: (1) Total solids at 110° C.: 34.4 percent; (2) Milliequivalent acid/gram: 0.129; (3) Milliequivalent base/gram: 0.265; (4) Particle size: 1250 angstroms (Å) and (5) GPC molecular weight: Mn =12,550; Mw =93,689; Mz =652,833.

Example 3B

An electrophoretic bath was prepared by blending 619.7 grams of the dispersion of Example 3A with 21.8 grams of trimethylolpropane triacrylate. A solution of 9.7 grams of 2-isopropyl thioxanthone and 9.7 grams of hexyl cellosolve was added to the blend under mild agitation. The entire bath was reduced to 10 percent solids using deionized water. The resulting bath had a pH of 4.35 and a conductivity of 635 micromhos per centimeter.

Panel preparation, electrocoat bath set up, exposure time, developing, and etching conditions were the same as those for Example 2B. Coat out conditions were 85° F. bath temperature, 50 volts electrical potential for 30 seconds. A film build of 5.7 microns was obtained based on an assumed coating density of 30 gm/m$^2$/mil. The coating was smooth and tack free with no noticeable pinholing or cratering. Following exposure, the photo tool peeled easily from the circuit board. No apparent residual coating material remained on the photo tool. Following developing, a "step 10" was held on the Stouffer 21 Step Tab and a resolution of 4 mil lines and spaces was reproduced from the photo tool image. Some 2 mil lines were removed during developing. Following etching, a resolution of 4 mils was achieved.

COMPARATIVE EXAMPLE 1A

The procedure of Example 2A was repeated except that no EBECRYL® 3600 was added to the resin prior to dispersion and no urethane acrylate was added. These materials were replaced on an equivalent for equivalent basis with trimethylolpropane trilacrylate "TMPTA" . A milky dispersion resulted with the following properties: (1) Total solids at 110° C.: 33.8; (2) Meq acid/gram: 0.128; (3) Meq base/gram: 0.388; (4) Particle size: 1330; and (5) Molecular weight: Mn=7,331; Mw=15,734; Mz=30,861. Molecular weight was measured by gel permeation chromatography "GPC" using a polystyrene standard.

COMPARATIVE EXAMPLE 1B

An electrophoretic bath was prepared by blending 567.1 grams of Comparative Example 1A with 24.3 grams of trimethylolpropane triacrylate. A solution of 9.7 grams of 2-isopropylthioxanthone and 9.7 grams of 2-hydroxy ethyl n-hexanol was added to this resin blend under mild agitation. The entire bath was reduced to 10 percent solids using deionized water. The resulting paint bath had a pH of 5.85 and a conductivity of 1040 micromhos per centimeter.

Panel preparation, electrocoat bath set up, exposure time, and developing conditions were the same as those for Example 2B. Coat out conditions were 85° F. bath temperature, 30 volts electrical potential for 30 seconds. A film build of 7.6 microns was obtained based on 30 grams/m$^2$/mil. The coating was smooth and tacky with no noticeable pinhole or cratering. Following exposure there was a noticeable sticking of the panel to the photo tool. Some residual coating material was left on the photo tool following removal. Following developing, a "step 3" was held on the Stouffer guide and a resolution of 2 mil lines and spaces was reproduced from the photo tool image.

COMPARATIVE EXAMPLE 2A

An amine-functional acrylic photosensitive polymeric composition was made according to Example 1, U.S. Pat. No. 4,592,816 to Emmons et al.

COMPARATIVE EXAMPLE 2B

Comparative Example 2A was used as an electrophoretic bath. The electrocoat bath set up and panel cleaning preparation was the same as for Example 2B. Coating conditions were reproduced from U.S. Pat. No. 4,592,816. Following coat out the sample was flash baked for 5 minutes at 82° C. Exposure conditions were three minutes in a Kepro® Model BTX-200A UV exposure unit. The system was tacky and showed significant sticking to the photo tool. Development occurred in a 15 weight percent solution of acetic acid at room temperature for 120 seconds. Following a water rinse, inspection showed that much material remained in the spaces of the circuit pattern. No etching was performed.

Development time was increased to 30 minutes. This caused the non-exposed areas to swell and start to be removed, but development was still not complete.

Examples 4A and 5A

A mixture of EPON 1001 (an epoxy resin available from Shell Chemical Co.) (1481.2 g, 3.8 equivalents) and methylisobutyl ketone (490 g) was heated in a 5-liter flask under mechanical agitation to 65° C. until dissolved. At this temperature, a mixture of 2-(methylamino)ethanol (118.3 g, 1.575 moles) and dibutylamine (67.9 g, 0.525 moles) was added over three minutes. An exotherm to 95° C. ensued. After the exotherm, the resin was heated to 110° C. and held for three hours. The resin was heated to reflux (119° C.) in order to remove any water present through a Dean-Stark trap. A portion of this mixture (1001.5 g) was then transferred to a separate 3-liter flask. To the portion of the amine-epoxy adduct solution that was not transferred to a separate flask was added 319.3 grams of an 80 percent by weight (in methylisobutyl ketone) solution of a urethane acrylate described in Example 1A over 45 minutes at 70° C. This mixture was held at 70° C. under agitation until no isocyanate groups were detectable in the mixture by infrared (IR) spectroscopy. At this point, 382.9 grams of EBECRYL®3600 (epoxy diacrylate) was added. This mixture (1600 g) was added to a mixture of 88 percent lactic acid (44.6 g, 0.436 equivalents) and deionized water (824.7 g) at 50° C. under vigorous agitation. After holding for 30 minutes under agitation, this dispersion was further diluted with 548.7 grams of deionized water, held for an additional 30 minutes, and finally diluted with 1509 grams of water. The dispersion thus obtained was subjected to vacuum azeotropic distillation in order to remove methylisobutyl ketone. The resulting dispersion had the following characteristics: (a) Total solids: 32.2 percent; (b) Milliequivalents acid per gram: 0.082; (c) Milliequivalents base per gram: 0.258; (d) Particle size: 1820 Å; and (e) GPC molecular weight: $Mn=11,423$, $Mw=110,507$, $Mz=694,537$.

Comparative Example 5A

The epoxy-amine adduct solution described in Example 4A that was transferred to a separate flask (1001.5 g) was heated to 70° C. under nitrogen. To this solution was added 276.8 grams of an 80 percent by weight solution (in methylisobutyl ketone) of an adduct made from one mole of n-propoxy propanol and one mole of isophorone diisocyanate (2 isocyanate equivalents) over 45 minutes. The synthesis of this adduct was exactly analogous to the synthesis of the urethane acrylate as described in Example 1A. After the adduct had been added, 150 grams of methylisobutyl ketone was added in order to control the viscosity of the solution. The mixture was held at 70° C. to 73° C. until no isocyanate groups remained as evidenced by infrared spectroscopy. EBECRYL®3600 (331.8 g) was then added and mixed well. This mixture (1475.8 g) was then added to a mixture of 570.2 grams of deionized water and 37.6 grams, 88 percent lactic acid at 50° C. After stirring vigorously for 30 minutes, 463.1 grams of additional water was added and the mixture was stirred an additional 30 minutes. Finally, 1273.3 grams of deionized water was added slowly. The methylisobutyl ketone in this dispersion was removed by vacuum azeotropic distillation. The analytical data for this final dispersion were as follows: (a) Total solids: 33.7 percent; (b) Milliequivalents acid per gram: 0.083; (c) Milliequivalents base per gram: 0.272; (d) Particle size—3370 Å; and (e) GPC molecular weight: $Mn=9,337$, $Mw=47,481$, $Mz=418,441$.

Thus, the dispersed resins described in Examples 4A and Comparative Example 5A are exactly alike except that the resin described in 4A has pendant unsaturation, whereas the resin described in Comparative Example 5A does not.

Example 4B

An electrophoretic bath was prepared from Example 4A by blending 655.9 grams of 4A with 24 grams of trimethylolpropane triacrylate under mild agitation. A solution consisting of 9.7 grams of hexyl Cellosolve and 9.7 grams of 2-isopropyl thioxanthone was then added to the resin blend under mild agitation. The entire bath was then reduced to 10.2 percent solids using deionized water. The resulting bath had a pH of 4.79 and a conductivity of 835 micromhos per centimeter.

Epoxy-fiber glass circuit boards (obtained from Nelco, Inc.) measuring 8 cm×12.5cm with ½ ounce per square foot copper on one side were placed in a detergent solution (ASTM D2248-65) at 165° F. for five minutes. The panels were then washed with hot water, followed by a deionized water rinse and an oven bake at 82° C. for five minutes. The panel was submerged in the prepared electrophoretic bath along with a stainless steel electrode measuring 5 cm×24 cm. Each was attached to a DC power supply, the panel being the cathode and the stainless steel electrode the anode. Cathode and anode are separated by a distance of approximately 5 cm, with the copper side of the board facing the stainless steel anode in the bath. The bath temperature was held at 85° F. and a magnetic stirrer was used to provide mild agitation. An electrical potential of 60 volts was applied for 30 seconds, after which time the panel was removed, rinsed with a water spray followed by a 0.1 percent by weight SURFYNOL® TG/deionized water rinse. The panel was then flashed in a forced air oven at 120° C. for 60 seconds. A film thickness of 5.3 microns was obtained. The coated panel was placed in a Kepro® Model BTX-200A UV exposure frame with a Stouffer 21 step—step tab. Exposure time was 3.5 minutes. The exposed film was developed by immersing the panel in a solution of 10 weight percent lactic acid at 80° F. for 75 seconds. The panel was then rinsed with a water spray and air dried. Etching occurred by spraying the sample with Kepro® E-4G ferric chloride solution in a Kepro® Model BTE-202 Bench Top Etcher. Etchant temperature was 110° F. and exposure time was 3.5 minutes. A Step 9 was held on the step tab following etching.

Degree of Tackiness was tested using a Sward hardness rocker, Model C, manufactured by the Paul M. Gardner Co. This test is based on the time it takes to damp a "rocker" placed on the coating. Softer more tacky films stop rocking more quickly (Modified ASTM D2134-66). A film thickness of approximately 0.2 mil was electrocoated on an aluminum panel and flash baked for one minute at 120° C. The unexposed panels were placed in a constant temperature (72° F.) and humidity (55 R.H.) room for four hours before testing was performed.

Each panel was leveled and the rocker set in motion on top of it. Counting begins when the bubble in the left tube fails to travel beyond its mark. Counting stops when the bubble in the right hand tube fails to travel beyond its mark. The number of complete oscillations multiplied by 2 gives the hardness value. The average value given for each panel is based on 6 replications.

An aluminum panel was coated at an electrical potential of 60 V. Following a 1 minute bake at 120° C., an average Sward hardness of 15.3 was obtained (number of trials, n=6; range=1 Sward unit). Sward hardness was run at a temperature of 72° F. and a relative humidity of 55 percent.

Example 5B

An electrophoretic bath was prepared from Example 5A by blending 626.7 grams of 5A with 24 grams of trimethylolpropane triacrylate under mild agitation. A solution consisting of 9.7 grams of hexyl Cellosolve and 9.7 grams of 2isopropyl thioxanthone was then added to the resin blend under mild agitation. The entire bath was then reduced to 10.2 percent solids using deionized water. The resulting paint bath had a pH of 4.92 and a conductivity of 890 micromhos per centimeter.

The substrate preparation and coating apparatus were identical to those found in Example 4B. An electrical potential of 60 volts was applied for 30 seconds. Following a bake of 120° C. for 60 seconds, a film build of 6.1 microns was obtained. Exposure, developing, and etching conditions were identical to those in Example 4B. Following etching, a 6 was held on the step tab.

An aluminum panel was coated at an electrical potential of 60 V. Following a 1 minute bake at 120° C., an average Sward hardness of 17.7 was obtained (n=6, range=4 Sward units).

Example 5C

An electrophoretic bath was prepared from Example 5A by blending 599.7 grams of 5A with 33 grams of trimethylolpropane triacrylate under mild agitation. This increase in TMPTA over Example 5B represents higher total acrylate functionality. A solution consisting of 9.7 grams of hexyl Cellosolve and 9.7 grams of 2-isopropyl thioxanthone was added to the resin blend under mild agitation. The entire bath was then reduced to 10.2 percent solids using deionized water. The resulting bath had a pH of 4.91 and a conductivity of 840 micromhos per centimeter.

The substrate preparation and coating apparatus were identical to those found in Example 4B. An electrical potential of 50 volts was applied for 30 seconds. Following a bake at 120° C. for 60 seconds, a film build of 5.3 microns was obtained. Exposure, developing and etching conditions were identical to those in Examples 4B and 5B. Following etching, a 6 was held on the step tab.

An aluminum panel was coated at an electrical potential of 50 volts. Following a 1 minute bake at 120° C., an average Sward hardness of 13.3 was obtained (n=6, range=2 Sward hardness units).

Example 5D

An electrophoretic bath was prepared from Example 5A by blending 484.3 grams of Example 5A with 48 grams of trimethylolpropane triacrylate under mild agitation. A solution consisting of 9.7 grams of hexyl Cellosolve and 9.7 grams of 2-isopropyl thioxanthone was then added to the resin blend under mild agitation. The entire bath was then reduced to 10.2 percent solids using deionized water. The resulting bath had a pH of 4.92 and a conductivity of 640 micromhos per centimeter.

The substrate preparation and coating apparatus were identical to those found in Example 4B. An electrical potential of 25 volts was applied for 30 seconds. Following a bake of 120° C. for 60 seconds, a film build of 6.1 microns was obtained. Exposure, developing and etching conditions were identical to those in Example 4B. Following etching, an 8 was held on the Step Tab.

An aluminum panel was coated at an electrical potential of 25 volts. Following a 1 minute bake at 120° C., an average Sward hardness of 7 was obtained (n=6, range=2 Sward units).

The effects of the amount and the position of the acrylate moiety on cure sensitivity and film hardness are shown in Table 1. Example 5B has a low level of acrylate, all of which occurs as lower molecular weight species (EBECRYL® 3600 and TMPTA). It shows a relatively high Sward hardness but a relatively low sensitivity. In Examples 5C and 5D acrylate functionality is increased in these systems by adding more low molecular weight acrylate species (TMPTA). It can be seen that sensitivity increases at the expense of film hardness. Example 4B has a portion of the acrylate functionality attached to the main polymer backbone. It shows the advantage of both good sensitivity and film hardness.

TABLE 1

| Ex-ample | Milliequivalent Unsaturation per Gram of Solids Attached to Backbone | Milliequivalent Nonionic Unsaturation per Gram of Solids | Milli-equivalent Unsaturation per gram of total solids | Step Tab | Sward Hard-ness |
| --- | --- | --- | --- | --- | --- |
| 4B | 0.42 | 1.82 | 2.26 | 9 | 15.3 |
| 5B | 0 | 1.82 | 1.82 | 6 | 17.7 |
| 5C | 0 | 2.16 | 2.16 | 6 | 13.3 |
| 5D | 0 | 2.62 | 2.62 | 8 | 7 |

(1) The number of steps on the Stouffer 21 step tablet which remain insoluble after development. The higher the rating, the better the sensitivity.
(2) Modified ASTM D2134-66 as described at page 27.

Therefore, what is claimed is:

1. A non-tacky, photosensitive electrodepositable photoresist composition comprising an aqueous dispersion of:

(a) a water dispersible unsaturated cationic polymeric material which is a reaction product of a first reactant having an average of more than one epoxy group per molecule and a second reactant selected from the group consisting of amines, sulfides, phosphines, and mixtures thereof, further reacted with a partially blocked isocyanate which is a reaction product of a polyisocyanate and an active hydroxyl-containing ethylenically-unsaturated compound having acrylate or methacrylate unsaturation, (b) a nonionic ethylenically unsaturated acrylate or methacrylate material, and (c) a photoinitiator;

wherein the composition has a combined unsaturation equivalent of 300 to 25,000 grams of resin solids per equivalent of unsaturation, the mount of cationic polymeric component (a) being chosen so as to provide 5 to 80 percent of the combined unsaturation, and the amount of nonionic component (b) being chosen so as to provide 95 to 20 percent of the combined unsaturation; and wherein the composition is characterized in that it forms a photosensitive, electrodeposited film which does not adhere to a photomask in a manner that would damage the film when the photomask is in intimate contact with the film, and areas exposed to actinic radiation of less than 500 millijoules per square centimeter have reduced solubility in dilute aqueous acid solution relative to unexposed portions of the film, both portions remaining soluble in strong aqueous acid solution.

2. An electrodepositable photoresist composition of claim 1 wherein said first reactant comprises a blend of at least one mono-epoxide and at least one polyepoxide and wherein said second reactant comprises an amine.

3. An electrodepositable photoresist composition of claim 2 wherein the amine is selected from the group consisting of ammonia, primary amine, secondary amine, tertiary amine or a mixture thereof.

4. An electrodepositable photoresist composition of claim 3 wherein the amine is dibutylamine, methylethanolamine or a mixture thereof.

5. An electrodepositable photoresist composition of claim 4 wherein the amine is a mixture of dibutylamine and methylethanolamine.

6. An electrodepositable photoresist composition of claim 1 wherein said first reactant comprises at least one polyepoxide.

7. An electrodepositable photoresist composition of claim 6 wherein the polyepoxide is a polyglycidylether of a polyol or an acrylic polymer containing epoxy groups.

8. An electrodepositable photoresist composition of claim 7 wherein the polyepoxide is a polyglycidylether of a polyol.

9. An electrodepositable photoresist composition of claim 6 wherein the polyepoxide contains an aromatic group.

10. An electrodepositable photoresist composition of claim 1 wherein the unsaturated cationic polymeric material contains an average of more than one ethylenically unsaturated moiety per molecule.

11. An electrodepositable photoresist composition of claim 1 wherein the polyisocyanate is isophorone diisocyanate, toluene diisocyanate, hexamethylene diisocyanate, methylene diphenyl diisocyanate or hydrogenated methylene diphenyl diisocyanate.

12. An electrodepositable photoresist composition of claim 1 wherein the active hydroxyl-containing ethylenically unsaturated compound is 2-hydroxyethyl acrylate, 2-hydroxyethyl methacrylate, 2-hydroxypropyl acrylate or 2-hydroxypropyl.

13. An electrodepositable photoresist composition of claim 1 wherein the nonionic ethylenically unsaturated material is selected from the group consisting of a diacrylate of a diglycidyl ether of bisphenol A, trimethylolpropane triacrylate, pentaerythritol triacrylate, a diacrylate ester of ethoxylated diphenols and a mixture thereof.

14. An electrodepositable photoresist composition of claim 1 wherein the photoinitiator is isopropyl thioxanthone or 2-chlorothioxanthone.

15. An electrodepositable photoresist composition of claim 1 wherein the nonionic ethylenically unsaturated material constitutes 5 to 40 percent by weight based on total resin solids of the composition.

16. An electrodepositable photoresist composition of claim 1 wherein the nonionic ethylenically unsaturated material contains an average of more than one ethylenically unsaturated moiety per molecule.

17. An electrodepositable photoresist composition of claim 1 wherein the nonionic ethylenically unsaturated material contains an average of at least two ethylenically unsaturated moieties per molecule.

18. An electrodepositable photoresist composition of claim 1 wherein the unsaturated cationic polymeric material has an unsaturation equivalent of from about 750 to 1,000,000.

19. An electrodepositable photoresist composition of claim 1 wherein the unsaturated cationic polymeric material has an unsaturation equivalent of from about 1,000 to 50,000.

* * * * *

UNITED STATES PATENT AND TRADEMARK OFFICE
CERTIFICATE OF CORRECTION

PATENT NO. : 5,674,660
DATED : October 7, 1997
INVENTOR(S) : Kurt G. Olson, et al.

It is certified that error appears in the above-identified patent and that said Letters Patent is hereby corrected as shown below:

Claim 1, line 18: Delete [mount] and insert --amount--
Claim 12, line 5: Before the "period" insert --methacrylate--

Signed and Sealed this

Twenty-second Day of December, 1998

Attest:

BRUCE LEHMAN

Attesting Officer

Commissioner of Patents and Trademarks